(12) United States Patent
Ohta et al.

(10) Patent No.: US 7,377,446 B2
(45) Date of Patent: May 27, 2008

(54) IC CARD

(75) Inventors: Eiji Ohta, Miyagi (JP); Shinichi Matsumura, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/725,073

(22) Filed: Dec. 1, 2003

(65) Prior Publication Data

US 2004/0159709 A1    Aug. 19, 2004

(30) Foreign Application Priority Data

Dec. 2, 2002    (JP) .......................... P2002-349983

(51) Int. Cl.
G06K 19/06    (2006.01)
G06K 5/00    (2006.01)
G06Q 40/00    (2006.01)
G07D 11/00    (2006.01)
G07F 19/00    (2006.01)

(52) U.S. Cl. ...................... 235/492; 235/379; 235/380; 235/487; 235/488

(58) Field of Classification Search ................ 235/492, 235/379, 380, 493, 487, 488; 438/106, 107; 361/737

See application file for complete search history.

(56) References Cited

U.S. PATENT DOCUMENTS

| | | | | |
|---|---|---|---|---|
| 4,841,134 A | * | 6/1989 | Hida et al. | 235/488 |
| 4,843,225 A | * | 6/1989 | Hoppe | 235/492 |
| 4,879,153 A | * | 11/1989 | Ohashi et al. | 428/76 |
| 5,026,452 A | * | 6/1991 | Kodai | 156/293 |
| 5,250,341 A | * | 10/1993 | Kobayashi et al. | 428/137 |
| 5,304,513 A | * | 4/1994 | Haghiri-Tehrani et al. | 156/245 |
| 5,346,576 A | * | 9/1994 | Kobayashi et al. | 156/293 |
| 5,701,002 A | * | 12/1997 | Oishi et al. | 235/487 |
| 5,851,854 A | * | 12/1998 | Haghiri-Tehrani et al. | 438/118 |
| 5,852,289 A | * | 12/1998 | Masahiko | 235/492 |
| 5,888,624 A | * | 3/1999 | Haghiri et al. | 428/195.1 |
| 6,166,911 A | * | 12/2000 | Usami et al. | 361/737 |
| 6,248,199 B1 | * | 6/2001 | Smulson | 156/244.12 |
| 6,283,378 B1 | * | 9/2001 | Welling | 235/492 |
| 6,305,609 B1 | * | 10/2001 | Melzer et al. | 235/487 |
| 6,352,767 B1 | * | 3/2002 | Kurokawa | 428/32.72 |
| 6,440,773 B1 | * | 8/2002 | Usami | 438/107 |

(Continued)

FOREIGN PATENT DOCUMENTS

EP    1 243 442    9/2002

(Continued)

Primary Examiner—Steven S. Paik
Assistant Examiner—Daniel Walsh
(74) Attorney, Agent, or Firm—Sonnenschein Nath & Rosenthal LLP

(57) ABSTRACT

To provide an IC card, which secures satisfied flatness of the card surface to achieve good printing properties on the card surface. An IC card has a core layer which includes a plurality of sheet materials wherein inner core sheets adjacent to an IC module have through holes formed in a region corresponding to the IC mounted portion, wherein a relationship $A=(B1+C1)\pm30$ μm is satisfied, where A (μm) represents the sum of heights of the through holes, B1 represents a projection height on an IC mounted surface of the IC module, and C1 represents a projection height on an IC non-mounted surface. By virtue of having this structure, the IC card can secure card flatness sufficient to obtain satisfied printing properties with respect to the rewrite sheet.

6 Claims, 6 Drawing Sheets

U.S. PATENT DOCUMENTS

| | | | |
|---|---|---|---|
| 6,492,717 B1 * | 12/2002 | Gore et al. | 257/679 |
| 6,607,135 B1 * | 8/2003 | Hirai et al. | 235/487 |
| 6,677,186 B1 * | 1/2004 | Zafrany et al. | 438/125 |
| 6,709,889 B2 * | 3/2004 | Gore et al. | 438/106 |
| 6,719,206 B1 * | 4/2004 | Bashan et al. | 235/492 |
| 6,764,014 B2 * | 7/2004 | Lasch et al. | 235/487 |
| 7,131,594 B2 * | 11/2006 | Ohta et al. | 235/492 |
| 2001/0040186 A1 * | 11/2001 | Okada | 235/492 |
| 2003/0038174 A1 * | 2/2003 | Jones | 235/380 |
| 2003/0057536 A1 * | 3/2003 | Akagawa | 257/679 |
| 2003/0102541 A1 * | 6/2003 | Gore et al. | 257/676 |
| 2003/0132302 A1 * | 7/2003 | Hattori | 235/492 |
| 2003/0226901 A1 * | 12/2003 | Kim et al. | 235/487 |
| 2004/0169086 A1 * | 9/2004 | Ohta et al. | 235/492 |
| 2005/0179122 A1 * | 8/2005 | Okawa et al. | 257/679 |

FOREIGN PATENT DOCUMENTS

| | | | |
|---|---|---|---|
| JP | 411048660 | * | 2/1999 |
| JP | 411078324 | * | 3/1999 |
| JP | 11-345298 | | 12/1999 |
| JP | 02000155822 | * | 6/2000 |
| JP | 2000-311225 | | 11/2000 |
| JP | 2002163624 | * | 7/2002 |
| JP | 2003-346112 | | 12/2003 |
| JP | 2003034009 | * | 2/2004 |
| JP | 02001101372 | * | 4/2005 |
| JP | 02004171100 | * | 6/2005 |
| JP | 02002197433 | * | 7/2005 |
| JP | 02001319210 | * | 11/2005 |
| WO | WO 01/20544 | | 3/2001 |

* cited by examiner

FIG.9

| | Core Layer | | | | | | | |
|---|---|---|---|---|---|---|---|---|
| | Outer Core S1 | | Inner Core S2 | | Inner Core S3 | | Outer Core S4 | |
| | Material | μm | Material | C(μm) | Material | B(μm) | Material | μm |
| Experimental Example 1 | PETG | 100 | PETG | 100[0] | PETG | 290[0] | PETG | 100 |
| Experimental Example 2 | | 100 | | 100[0] | | 250[-40] | | 100 |
| Experimental Example 3 | | 100 | | 100[0] | | 260[-30] | | 100 |
| Experimental Example 4 | | 100 | | 100[0] | | 270[-20] | | 100 |
| Experimental Example 5 | | 100 | | 100[0] | | 300[+10] | | 100 |
| Experimental Example 6 | | 100 | | 100[0] | | 310[+20] | | 100 |
| Experimental Example 7 | | 100 | | 100[0] | | 320[+30] | | 100 |
| Experimental Example 8 | | 100 | | 100[0] | | 350[+60] | | 100 |
| Experimental Example 9 | | 100 | | 50[-50] | | 290[0] | | 100 |
| Experimental Example 10 | | 100 | | 70[-30] | | 290[0] | | 100 |
| Experimental Example 11 | | 100 | | 80[-20] | | 290[0] | | 100 |
| Experimental Example 12 | | 100 | | 110[+10] | | 290[0] | | 100 |
| Experimental Example 13 | | 100 | | 120[+20] | | 290[0] | | 100 |
| Experimental Example 14 | | 100 | | 130[+30] | | 290[0] | | 100 |
| Experimental Example 15 | | 100 | | 150[+50] | | 290[0] | | 100 |
| Experimental Example 16 | | 100 | | 100[0] | | 290[0] | | 100 |
| Experimental Example 17 | | 100 | | 100[0] | | 290[0] | PETG/PC | 100 |
| Experimental Example 18 | | 150 | | 100[0] | | 250[-40] | – | – |
| Experimental Example 19 | | 150 | | 100[0] | | 260[-30] | – | – |
| Experimental Example 20 | | 150 | | 100[0] | | 270[-20] | – | – |
| Experimental Example 21 | | 150 | | 100[0] | | 290[0] | – | – |
| Experimental Example 22 | | 150 | | 100[0] | | 300[+10] | – | – |
| Experimental Example 23 | | 150 | | 100[0] | | 310[+20] | – | – |
| Experimental Example 24 | PETG/PC=5/5 | 150 | PETG/PC=5/5 | 100[0] | PETG/PC=5/5 | 320[+30] | – | – |
| Experimental Example 25 | | 150 | | 100[0] | | 350[+60] | – | – |
| Experimental Example 26 | | 150 | | 50[-50] | | 300[+10] | – | – |
| Experimental Example 27 | | 150 | | 70[-30] | | 300[+10] | – | – |
| Experimental Example 28 | | 150 | | 80[-20] | | 300[+10] | – | – |
| Experimental Example 29 | | 150 | | 110[+10] | | 300[+10] | – | – |
| Experimental Example 30 | | 150 | | 120[+20] | | 300[+10] | – | – |
| Experimental Example 31 | | 150 | | 130[+30] | | 300[+10] | – | – |
| Experimental Example 32 | | 150 | | 150[+50] | | 300[+10] | – | – |
| Experimental Example 33 | PVC | 100 | PVC | 100[0] | PVC | 290[0] | PVC | 100 |
| Experimental Example 34 | PVC | 150 | PVC | 100[0] | PVC | 290[0] | – | – |
| Experimental Example 35 | PETG/PC=3/7 | 100 | PETG/PC=3/7 | 100[0] | PETG/PC=3/7 | 290[0] | PETG/PC=3/7 | 100 |
| Experimental Example 36 | PETG/PC=5/5 | 150 | PETG/PC=5/5 | 100[0] | PETG/PC=5/5 | 150 | PETG/PC=5/5 | 150 |

FIG.10

| | Sum of Heights of Sheet Through Holes A(μm) | Printing Properties | Printing Properties after Heat Resistance Test | Generation of Halogen Gas during Incineration |
|---|---|---|---|---|
| Experimental Example 1 | 390[0] | ○ | △ | None |
| Experimental Example 2 | 350[−40] | × | × | None |
| Experimental Example 3 | 360[−30] | △ | × | None |
| Experimental Example 4 | 370[−20] | ○ | △ | None |
| Experimental Example 5 | 400[+10] | ○ | × | None |
| Experimental Example 6 | 410[+20] | △ | × | None |
| Experimental Example 7 | 420[+30] | △ | × | None |
| Experimental Example 8 | 450[+60] | × | × | None |
| Experimental Example 9 | 340[−50] | × | × | None |
| Experimental Example 10 | 360[−30] | △ | × | None |
| Experimental Example 11 | 370[−20] | ○ | △ | None |
| Experimental Example 12 | 400[+10] | ○ | △ | None |
| Experimental Example 13 | 410[+20] | △ | × | None |
| Experimental Example 14 | 420[+30] | △ | × | None |
| Experimental Example 15 | 440[+50] | × | × | None |
| Experimental Example 16 | 390[0] | ○ | ○ | None |
| Experimental Example 17 | 390[0] | ○ | ○ | None |
| Experimental Example 18 | 350[−40] | × | × | None |
| Experimental Example 19 | 360[−30] | ○ | ○ | None |
| Experimental Example 20 | 370[−20] | ◎ | ◎ | None |
| Experimental Example 21 | 390[0] | ◎ | ◎ | None |
| Experimental Example 22 | 400[+10] | ◎ | ◎ | None |
| Experimental Example 23 | 410[+20] | ○ | ○ | None |
| Experimental Example 24 | 420[+30] | ○ | ○ | None |
| Experimental Example 25 | 450[+60] | × | × | None |
| Experimental Example 26 | 350[−40] | × | × | None |
| Experimental Example 27 | 370[−20] | ◎ | ◎ | None |
| Experimental Example 28 | 380[−10] | ◎ | ◎ | None |
| Experimental Example 29 | 410[+20] | ○ | ○ | None |
| Experimental Example 30 | 420[+30] | ○ | ○ | None |
| Experimental Example 31 | 430[+40] | × | × | None |
| Experimental Example 32 | 450[+60] | × | × | None |
| Experimental Example 33 | 390[0] | ◎ | × | Generated |
| Experimental Example 34 | 390[0] | ◎ | × | Generated |
| Experimental Example 35 | 390[0] | ◎ | ◎ | None |
| Experimental Example 36 | 400[+10] | ◎ | ◎ | None |

IC CARD

RELATED APPLICATION DATA

The present application claims priority to Japanese Application(s) No(s). P2002-350640 filed Dec. 3, 2002, which application(s) is/are incorporated herein by reference to the extent permitted by law.

BACKGROUND OF THE INVENTION

1. Field of the Invention

The present invention relates to an IC card having an information recording medium for use in, for example, an ID card (identification card), a membership card, a prepaid card, a cash card, a commuter's pass and the like. More particularly, the present invention is concerned with an IC card having both recorded information of electronic data and visible information.

2. Description of Related Art

Conventionally, in ID cards for identifying individuals, a method for magnetically or optically reading information recorded has been widely used in a credit card and the like. However, the techniques are popularized and the data in the cards is easily altered or forged cards are spread, and there are increasing cases where people actually suffer damage from the forged cards. For this reason, in recent years, as means capable of controlling and protecting personal data, an IC card having an IC chip incorporated has drawn attention since it has a large data capacity and it can contain coded data.

Data to be recorded on an IC card is contained in an IC chip incorporated into the IC card. Therefore, for display or reading of the data recorded on the IC card, it is necessary to read the recorded data by means of a special reading apparatus, and therefore general users cannot read the data by themselves. For example, in membership cards in which a high premium or a point is put on members, inquiry by an information note or the like is separately required for if it is merely recorded onto the card. Further, when merely recording data onto a card of a commuter's pass, a means for reading the data is separately required.

There are increasing demands of easy display of the recorded data and, recently, for meeting the demands, a technique has been developed in which a polymer/low-molecule-type rewritable display medium, which contains an organic low molecule dispersed in a resin binder, and which achieves display by utilizing the opaque-transparent contrast, or a rewritable display medium, which contains a leuco compound and a color developing and erasing agent which reacts with the leuco compound dispersed in a resin binder, and which controls heat energy so that the leuco compound colors or erases the color, is provided as a rewritable display layer on the surface of a card. The above rewritable display layer is constituted by support, e.g., a plastic sheet, colored layer, recording (polymer/low-molecule or leuco compound, color developing and erasing agent) layer and protecting layer.

The rewritable display layer is formed on at least one surface of a shaped article having an IC module disposed between multilayered plastic sheets including two or more layers wherein the IC module has an IC mounted portion reinforced by a sealing resin or a reinforcing plate.

The IC module includes an IC chip mounted on an insulating substrate having an antenna coil, and the IC mounted portion of the IC module partially has a projection on the front and back surfaces due to the sealing resin or reinforcing plate provided thereon. For this reason, there is a problem in that the uneven surface of the IC module causes the card surface to be uneven during forming of the card and to lower the flatness and hence a spacing loss is caused between the rewritable display layer and a printing head during a printing operation, leading to an occurrence of print missing or slight touching, so that satisfied printing properties cannot be secured. Therefore, recently in the IC card production technique, it is very important to develop a method for securing favorable flatness of surface of the card after being formed.

As a conventional technique for improving the flatness of the card surface, for example, a structure of a card in which a through hole (relief hole) is formed in a plastic sheet stacked on an IC module in a region corresponding to the IC mounted portion so as to absorb the uneven surface of the IC module is described in patent document 1 shown below. In addition, a structure of a card in which the multilayered plastic sheet is improved in the combination of sheet thickness or the constituent materials to adjust the fluidity of the resins so as to absorb the uneven surface of the IC module is described in patent document 2 shown below.

[Patent Document 1]
Japanese Patent Application Publication No. 2001-319210

[Patent Document 2]
Japanese Patent Application Publication No. 2001-283175

SUMMARY OF THE INVENTION

As mentioned above, a conventional IC card cannot achieve satisfied flatness of the surface due to the uneven surface of the IC mounted portion of the IC module incorporated, and therefore the IC card having a rewritable display layer on its surface poses a problem in that a spacing loss is caused when indicating the recorded data on the card surface by means of a printing head and thus print missing or slight touching occurs, lowering the printing properties.

In view of the above problems, the present invention has been made and a task is to provide an IC card which secures satisfied flatness of the card surface to achieve satisfied printing properties on the card surface.

The present inventors have conducted extensive and intensive studies with a view toward solving the above problems. As a result, they have found that, when the projection height in the IC mounted portion of the IC module and the height of the through holes for containing the IC mounted portion wherein the through holes are formed in the sheet materials constituting the core layer having the IC module disposed therein meet a certain requirement, the flatness of surface of the card after being formed can be improved, and the present invention has been completed.

Specifically, an IC card of the present invention has a characteristic feature such that, when the sum of the heights of the through holes is taken as A (μm), the projection height on the IC mounted surface of the IC module is taken as $B_1$ (μm) and the projection height on the IC non-mounted surface of the IC module is taken as $C_1$ (μm), the value of A falls in the range of $(B_1+C_1)\pm 30$ μm.

When the sum A of the heights of the through holes is larger than the sum of the projection heights $B_1$, $C_1$ of the IC module, an empty region in which the IC mounted portion is not contained is formed in the through hole to cause a step. This step is filled with a molten resin which flows from the periphery during the forming, so that the card surface portion above the IC mounted portion is prevented from becoming uneven, thus improving the flatness of the card surface. In addition, when the sum A of the heights of the through holes is smaller than the sum of the projection heights B1, C1 of the IC module, the IC mounted portion projecting from the through hole forms a step, and the sheet materials stacked on the step are molten by heating during the forming and spread to absorb the step, so that the card surface portion above the IC mounted portion is prevented from becoming uneven, thus improving the flatness of the card surface.

On the other hand, when the difference between the sum A of the heights of the through holes and the sum of the projection heights (B1+C1) is larger than 30 µm, an empty region caused in this case is not absorbed satisfactorily during the forming process and eventually causes the card surface to be uneven, so that favorable printing properties cannot be obtained.

Another IC card of the present invention has a characteristic feature such that, when the projection height on the IC mounted surface of the IC module is taken as B1 (µm), the projection height on the IC non-mounted surface of the IC module is taken as C1 (µm), the height of the through hole on the side of the IC mounted surface of the IC module is taken as B (µm), and the height of the through hole on the side of the IC non-mounted surface of the IC module is taken as C (µm), a relationships B=B1±30 µm, and C=C1±30 µm are satisfied. It is noted that, when C1 is 0, C is 0.

When the heights B, C of the through holes are respectively larger than the projection heights B1, C1 of the IC module, an empty region in which the IC mounted portion is not contained is present in the through hole. This region is filled with a molten resin which flows from the periphery during the forming, so that the card surface portion above the IC mounted portion is prevented from becoming uneven, thus improving the flatness of the card surface. In addition, when the heights B, C of the through holes are respectively smaller than the projection heights B1, C1 of the IC module, the IC mounted portion projecting from the through hole forms a step, and the sheet materials stacked on the step are molten by heating during the forming and spread to absorb the step, so that the card surface portion above the IC mounted portion is prevented from becoming uneven, thus improving the flatness of the card surface.

On the other hand, when the difference between the height B of the through hole and the projection height B1 and the difference between the height C of the through hole and the projection height C1 are individually larger than 30 µm, the step caused in this case is not absorbed satisfactorily during the forming process and eventually causes the card surface to be uneven, so that favorable printing properties cannot be obtained.

Thus, by virtue of having a structure such that the sum A of the heights of the through holes or the heights B and C of the individual through holes fall within the above range, the surface of the card after being formed can secure favorable flatness to achieve favorable printing properties on the card surface.

In the IC card of the present invention, by adjusting the relationship between the projection height in the IC mounted portion of the IC module and the height of the through holes formed in the sheet materials having the IC module disposed therebetween, an IC card having flatness sufficient to secure satisfied printing properties with respect to the rewritable rewritable display layer formed on the card surface can be obtained.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIG. 9 is a table illustrating materials of inner and outer cores of a core layer and their respective thicknesses as utilized in a plurality of experimental examples; and FIG. 10 is a table illustrating experimental examples of a structure of the core layer, results of evaluations of printing properties and printing properties after a heat resistance test, and a generation of halogen gas during an incineration.

DESCRIPTION OF THE PREFERRED EMBODIMENTS

Hereinbelow, preferred embodiments of the present invention will be described with reference to the drawings.

Figure 1:
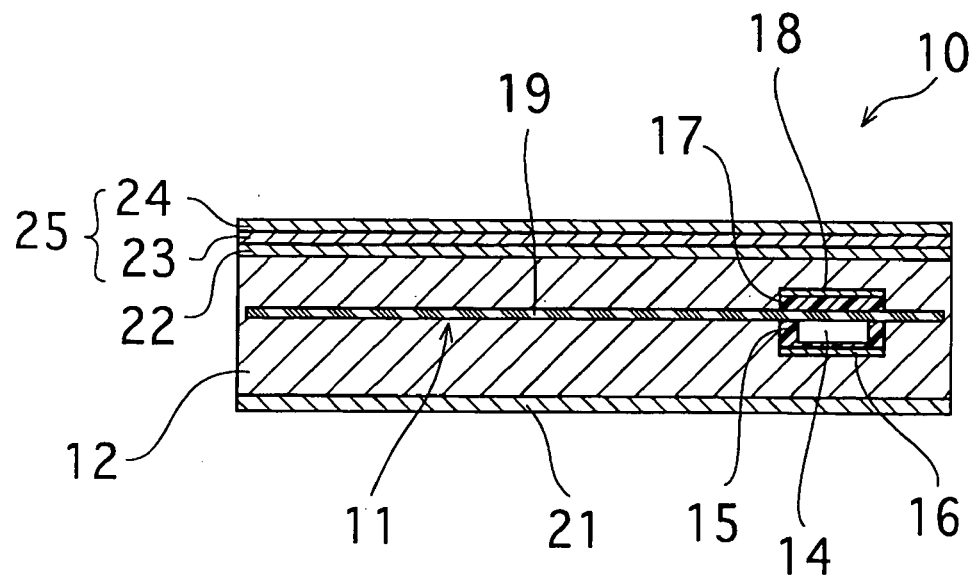
FIG. 1 is a sectional side view showing one example of the structure of an IC card 10 according to an embodiment of the present invention.

FIG. 1 shows one example of the structure of a non-contact IC card 10 according to an embodiment of the present invention. A core layer 12 including a plurality of thermoplastic plastic sheets fused together has an IC module 11 disposed therein. In FIG. 1, on the upper surface of the core layer 12, a rewrite sheet 25 including a rewritable rewritable heat-sensitive recording layer 23 and a protecting layer 24 is stacked on an outer sheet 22 as a printing sheet. An outer sheet 21 as a printing sheet is stacked on the lower surface of the core layer 12.

The IC module 11 includes an insulating substrate 19, an antenna coil formed on the insulating substrate 19, an IC chip 14 mounted on the antenna coil, an sealing resin 15 for encapsulating the IC chip 14, and a reinforcing plate 16 formed on the IC chip 14 through the sealing resin 15. If desired, a reinforcing plate 18 is provided through a sealing resin (adhesive material) 17 on an IC mounted portion on the IC non-mounted surface (upper surface as viewed in FIG. 1) of the insulating substrate 19.

Figure 2:
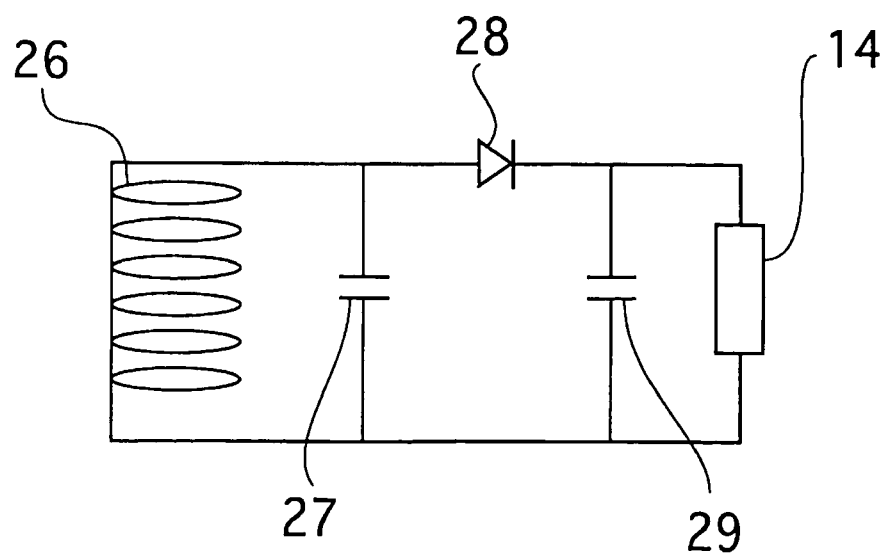
FIG. 2 is a view showing a circuit configuration of the IC card 10.

FIG. 2 shows a basic circuit configuration of the IC module 11 in the present embodiment. The IC module 11 has a structure such that a rectifying diode 28, a smoothing capacitor 29, and the IC chip 14 are connected to a resonance circuit, which is constituted of an antenna coil 26 and a tuning capacitor 27. The antenna coil 26 is used as a part separated from the IC chip 14, but the tuning capacitor 27, rectifying diode 28, and smoothing capacitor 29 may be incorporated into the IC chip 14.

Figure 3:
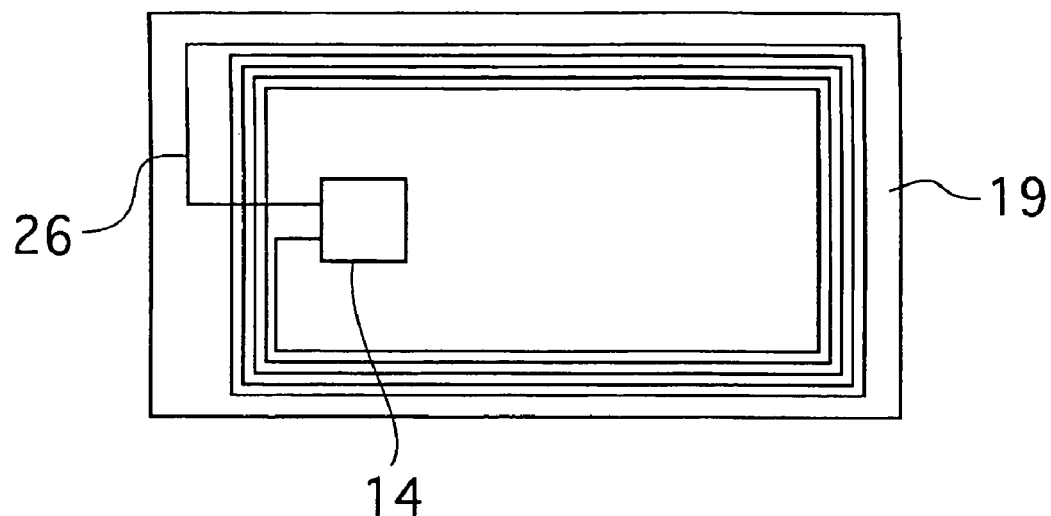
FIG. 3 is a plan view of an IC module 11 constituting the IC card 10.

The antenna coil and other conductor patterns used in the IC card 10 having the circuit configuration shown in FIG. 2 are formed by subjecting to pattern etching treatment a foil or line product having electrical conductivity, e.g., copper, aluminum, gold, or silver, or a conductor layer formed from the above metal on the insulating substrate 19 using a vapor deposition or plating method. FIG. 3 is a diagrammatic plan view of the IC mounted surface of the IC module 11, and shows that the IC chip 14 is connected to the individual end portions of the antenna coil 26.

The insulating substrate 19 is comprised of a single material, e.g., polyimide; polyester, such as polyester, polyethylene terephthalate, or polyethylene naphthalate; polyolefin, such as propylene; cellulose, such as cellulose triacetate or cellulose diacetate; a vinyl resin, such as an acrylonitrile-butadiene-styrene resin, an acrylonitrile-styrene resin, polystyrene, polyacrylonitrile, polymethyl acrylate, polymethyl methacrylate, polyethyl acrylate, polyethyl methacrylate, vinyl acetate, or polyvinyl alcohol; or polycarbonate, or a mixture thereof, and any organic materials can be used as long as they have insulation properties. With respect to the thickness and the elastic modulus, a plastic film having an elastic modulus of 300 N/m$^2$ or more and a thickness of 20 to 100 μm can be used.

As an example of a method for forming, on the insulating substrate 19, the antenna coil 26, the tuning capacitor 27, the rectifying diode 28, the smoothing capacitor 29, the IC chip 14 and the like, there can be mentioned a method of fixing them together using a polymeric organic substance/low-molecular organic substance or a composite thereof.

As a usable resin, a single material of a thermoplastic resin, e.g., a polyester polyurethane resin; a polyurethane resin; a polyester resin; a vinyl resin, such as an acrylonitrile-butadiene-styrene resin, an acrylonitrile-styrene resin, polystyrene, polyacrylonitrile, polymethyl acrylate, polymethyl methacrylate, polyethyl acrylate, polyethyl methacrylate, vinyl acetate, or polyvinyl alcohol; or polycarbonate, or a mixture thereof can be used.

Further, a conventionally known binder resin, e.g., a thermosetting resin, such as a phenolic resin, an epoxy resin, or a silicone resin, can be used. As the reactive organic low-molecular agent, a compound having at least two or more isocyanate (NCO) per molecule or a compound having an epoxy functional group can be used, and a mixture of the compound having a reactive functional group and a compound having a functional group having reactivity, e.g., a hydroxyl group, an amino group or the like can be used.

Figure 4:
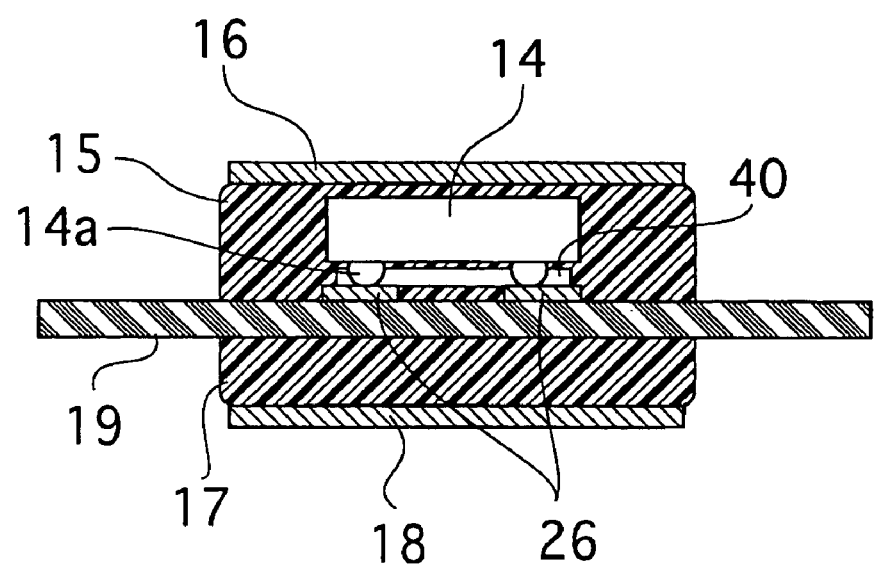
FIG. 4 is a sectional side view showing the structure of an IC mounted portion of the IC module 11.

As an example of a method for connecting the IC chip 14 to the antenna coil 26, there can be mentioned, as shown in FIG. 4 indicating the portion of the IC chip 14 upside down, a method in which a protruding electrode (bump) 14*a* formed on the active surface of the IC chip 14 is connected to the antenna coil 26 through an anisotropic conductive adhesive layer 40 by face down bonding. The anisotropic conductive adhesive layer 40 is made of conductive particles dispersed in an adhesive resin, and can achieve conductivity only in the thickness wise direction.

As the adhesive resin for the anisotropic conductive adhesive layer 40, a single material, e.g., a polyurethane resin; a polyester polyurethane resin; a vinyl resin, such as an acrylonitrile-butadiene-styrene resin, an acrylonitrile-styrene resin, polystyrene, polyacrylonitrile, polymethyl acrylate, polymethyl methacrylate, polyethyl acrylate, polyethyl methacrylate, vinyl acetate, or polyvinyl alcohol; a polycarbonate resin; or an epoxy resin, or a mixture or composite thereof can be used.

As the conductive particles dispersed in the adhesive resin, Au, Ni, Al, Sn, or particles obtained by subjecting the surface of nonconductive particles, hollow particles, or foil pieces to conductivity treatment (physical or chemical treatment using Au, Ni, Al, or Sn) can be used. These conductive particles may be dispersed in the adhesive resin in a state such that they have a surface nonconductivity-treated with an organic substance or the like. In mounting of the IC chip 14, when the IC chip 14 is pressed and heated, the nonconductivity-treated layer on the surface of the nonconductivity-treated particles breaks and the conductor surface is exposed, creating an electrical connection between the IC chip 14 and the antenna pattern 26.

The sealing resin 15 provided for encapsulating the IC chip 14 is introduced so as to encapsulate the IC chip 14 mounted on the insulating substrate 19. As the sealing resin 15, an epoxy, silicon, or phenolic thermosetting resin can be used. For suppressing a stress on the IC chip 14 due to volume shrinkage caused by the thermosetting reaction, a single material of filler, hollow particles, or foil pieces, or a composite thereof is dispersed in the sealing resin 15. The filler, hollow particles, or foil pieces used has a size or particle size and a mixing ratio appropriately adjusted for suppressing a stress caused by shrinkage. The reinforcing plate 16 is provided on the sealing resin 15 so as to cover the IC chip 14 before the sealing resin 15 is cured.

In the reinforcing plate 16 used here, a material having a Vickers hardness of 200 to less than 580 is suitable. The Vickers hardness is determined in accordance with the measurement method described in JIS-Z2244, and a Vickers hardness tester specified in JIS-B7725 is used. With respect to the form and size of the reinforcing plate 16, one having a circular form or substantially circular form having a diameter equal to or larger than the longest length of the IC chip 14 is used. Examples of materials having a Vickers hardness of 200 to less than 580 include nonferrous metal materials, such as Cu—Sn—P, Ni—Cu—Zn, and Cu—Be—Ni—Co—Fe; nickel alloy materials, such as Ni—Co, Ni—Cr, and Ni—Mo—Cu; nickel-iron alloy materials, such as Ni—Fe; titanium-molybdenum-stainless steel materials, such as SUS304, SUS301, SUS316, SUS631, ASL350, SUS430, and SUS420; and carbon steel, such as SK materials, and materials having further improved hardness obtained by subjecting the above material to thermal treatment can be used. The reinforcing plate 16 used may have a thickness of 30 μm or more, preferably 50 μm or more, and, for obtaining a card having a thickness which falls in the range specified in ISO standard, it is desired that the upper limit of the thickness of the reinforcing plate 16 is 100 μm or less.

The sealing resin 17 and reinforcing plate 18 provided on the IC mounted portion on the IC non-mounted surface of the IC module 11 are comprised of the above-described materials. The IC chip 14 is disposed between the two reinforcing plates 16, 18 and hence improved in resistance to bending due to an external force, so that the reliability of the IC card 10 can be secured.

Figure 7:
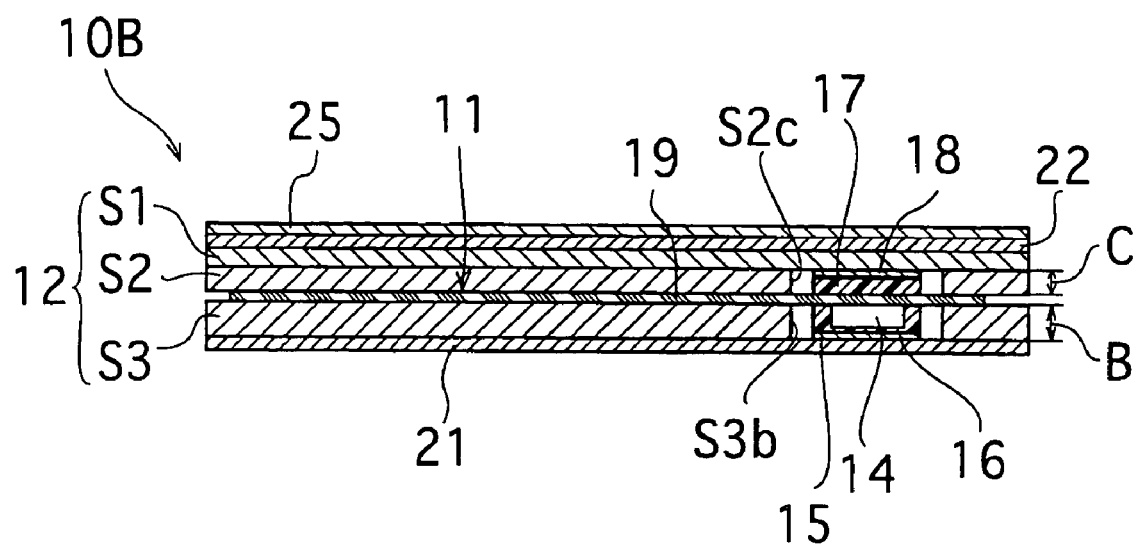
FIG. 7 is a sectional side view of an IC card, showing another example of the structure of the core layer 12.
Figure 8:
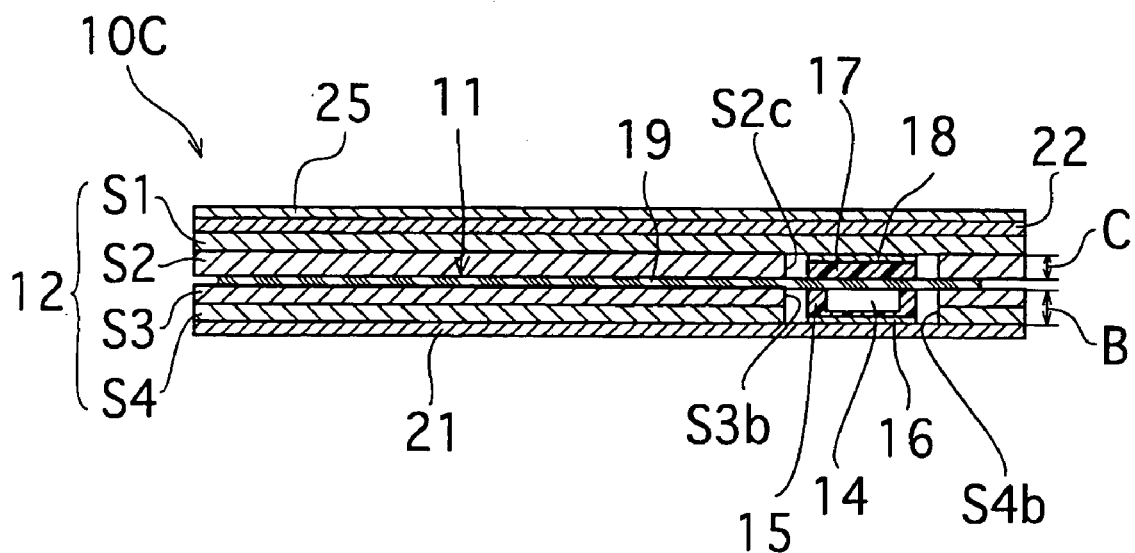
FIG. 8 is a sectional side view of an IC card, showing still another example of the structure of the core layer 12.

Next, the structure of the core layer 12 in the present invention is described. The core layer 12 has the IC module 11 shown in FIG. 5 disposed therein, and has a laminate of a plurality of sheet materials having the IC module 11 disposed therebetween. Examples of structures of the core layer 12 prior to forming (prior to hot-press) are shown in FIGS. 6 to 8.

Figure 6:
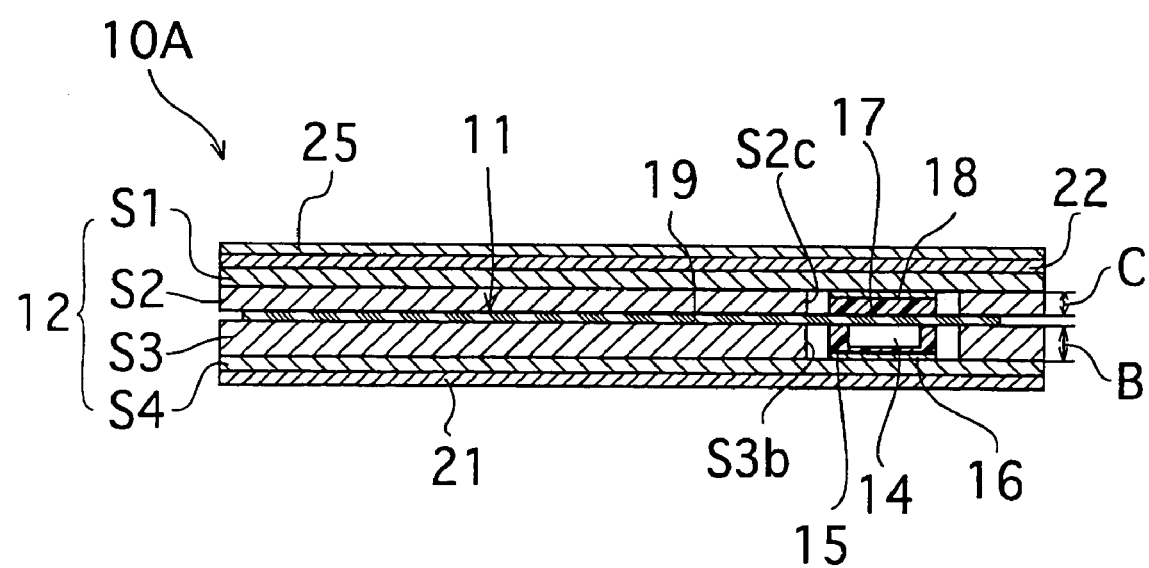
FIG. 6 is a sectional side view of an IC card, showing one example of the structure of a core layer 12 having the IC module 11 disposed therein.

An IC card 10A shown in FIG. 6 is an example in which the core layer 12 includes a pair of outer core sheets S1, S4 and a pair of inner core sheets S2, S3. The inner core sheet S2 is adjacent to the IC module 11 on the side of the IC non-mounted surface, and the inner core sheet S3 is adjacent to the IC module 11 on the side of the IC mounted surface. The outer core sheet S1 is stacked on the inner core sheet S2, and the outer core sheet S4 is stacked on the inner core sheet S3.

The inner core sheets S2, S3 have, respectively, through holes S2c, S3b provided in portions corresponding to the respective chip mounted portions of the IC module 11. The through holes S2c, S3b are formed so that they are larger than the individual outer diameters of the sealing resins 15, 17 and reinforcing plates 16, 18 provided on the IC mounted portion of the IC module 11, and, when the inner core sheets S2, S3 are individually stacked on the IC module 11, the through hole S3b contains therein the IC chip 14, the sealing resin 15, and the reinforcing plate 16 and the through hole S2c contains therein the sealing resin 17 and the reinforcing plate 18 (see FIG. 6).

Figure 5:
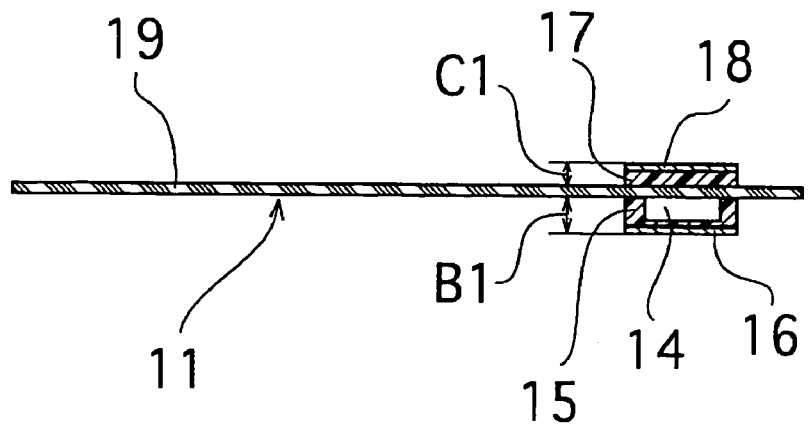
FIG. 5 is a sectional side view showing whole of the IC module 11.

In the present embodiment, the sum A (=B+C) of a height B (μm) of the through hole S3b and a height C (μm) of the through hole S2c is set to be, as shown in FIG. 5, in the range of (B1+C1)±30 μm wherein B1 (μm) represents a projection height of the IC mounted portion on the IC mounted surface of the IC module 11, and C1 (μm) represents a projection height of the IC mounted portion on the IC non-mounted surface of the IC module 11.

When the sum A of the heights of the through holes S3b, S2c is larger than the sum of the projection heights B1, C1 of the IC module 11, an empty region in which the IC mounted portion is not contained is formed in the through hole to cause a step. This step is filled with a molten resin which flows from the periphery during the hot-press, so that the card surface portion above the IC mounted portion is prevented from becoming uneven, thus improving the flatness of the card surface. In addition, when the sum A of the heights of the through holes S3b, S2c is smaller than the sum of the projection heights B1, C1 of the IC module 11, the IC mounted portion projecting from the through hole forms a step, and the sheet materials stacked on the step are molten by heating during the hot-press and spread to absorb the step, so that the card surface portion above the IC mounted portion is prevented from becoming uneven, thus improving the flatness of the card surface.

On the other hand, when the difference between the sum A of the heights of the through holes S3b, S2c and the sum of the projection heights (B1+C1) is larger than 30 μm, the step caused in this case is not absorbed satisfactorily during the hot-press step and eventually causes the card surface to be uneven, so that favorable printing properties cannot be obtained.

When the core layer 12 is configured so as to meet the above requirement, not only can deformation of the printed patterns on the outer sheets 21, 22 in the IC mounted portion be suppressed, but also the card surface on which the rewrite sheet 25 is formed can be improved in flatness, so that no spacing loss is caused between the rewrite sheet 25 and a printing head, thus making it possible to secure satisfactory printing properties.

It is more preferred that the sum A of the heights of the through holes S3b, S2c is set so as to satisfy a relationship (B1+C1)−20 μm≦A≦(B1+C1)+10 μm. In this case, the flatness of the card surface is further improved, so that very favorable printing properties with respect to the rewrite sheet 25 can be obtained.

Further, when the height B of the through hole S3b is in the range of B1±30 μm and the height C of the through hole S2c is in the range of C1±30 μm, further favorable effect can be obtained.

When the heights B, C of the through holes S3b, S2c are respectively larger than the projection heights B1, C1 of the IC module 11, an empty region in which the IC mounted portion is not contained is present in the through hole. This region is filled with a molten resin which flows from the periphery during the hot-press, so that the card surface portion above the IC mounted portion is prevented from becoming uneven, thus improving the flatness of the card surface. In addition, when the heights B, C of the through holes S3b, S2c are respectively smaller than the projection heights B1, C1 of the IC module 11, the IC mounted portion projecting from the through hole forms a step, and the sheet materials stacked on the step are molten by heating during the hot-press and spread to absorb the step, so that the card surface portion above the IC mounted portion is prevented from becoming uneven, thus improving the flatness of the card surface.

On the other hand, when the difference between the height B of the through hole S3b and the projection height B1 and the difference between the height C of the through hole S2c and the projection height C1 are individually larger than 30 μm, the step caused in this case is not absorbed satisfactorily during the hot-press step and eventually causes the card surface to be uneven, so that favorable printing properties cannot be obtained.

The height B of the through hole S3b and the height C of the through hole S2c can be determined from, respectively, the sheet thickness of the inner core sheet S3 and the inner core sheet S2, in which these through holes are formed.

When the IC non-mounted surface of the IC module 11 is reinforced by neither an sealing resin nor a reinforcing plate, the inner core sheet adjacent to the IC non-mounted surface has no through hole. That is, when C1 is 0, C is 0.

The structure of the core layer 12 is not limited to the structure shown in FIG. 6. For example, an IC card 10B shown in FIG. 7 has a structure as an example in which an outer sheet 21 is stacked without an outer core sheet directly on an inner core sheet S3 stacked on the IC mounted surface of the IC module, and the structure other than this point is similar to the structure example shown in FIG. 6. The IC card 10B is constructed so that the sum A of the heights of the through holes S3b, S2c formed in the inner core sheets S3, S2 and the sum of the projection heights (B1+C1) of the IC mounted portions of the IC module 11 satisfy a relationship A=(B1+C1)±30 μm.

On the other hand, the core layer 12 of an IC card 10C shown in FIG. 8 has a structure in which a hole S4b is formed in an outer core sheet S4 stacked on the IC mounted surface of the IC module 11 so that the hole S4b is aligned with the through hole S3b in the inner core sheet S3 adjacent to the outer core sheet S4 and has the same form as that of the through hole S3b. The structure in this case also satisfies the above formula, i.e., a relationship A=B+C=(B1+C1)±30 μm. In this case, the height B of the through hole on the side of the IC mounted surface of the IC module 11 corresponds to the sum of the height of the through hole S3b in the inner core sheet S3 and the height of the through hole S4b in the outer core sheet S4.

The structure of the core layer 12 is not limited to the above examples and, for example, the inner core sheet stacked on the IC mounted surface and/or the IC non-mounted surface of the IC module 11 may be comprised of a laminate of a plurality of sheet materials. In this case, the height of the through holes in which the IC mounted portion is contained is determined by the total thickness of the sheet materials in which the through holes are formed.

As the inner core sheets S2, S3 and the outer core sheets S1, S4 constituting the core layer 12, those comprised of a crystalline thermoplastic resin having a crystallinity as low as 5% or less are used. As the crystalline thermoplastic resin having a crystallinity as low as 5% or less, specifically, a single material of a noncrystalline resin, e.g., a copolymer (PETG) of terephthalic acid, cyclohexanedimethanol, and ethylene glycol; an alloy of the copolymer and polycarbonate (PC); a copolymer of terephthalic acid, isophthalic acid, and ethylene glycol; an acrylonitrile-butadiene-styrene copolymer resin; a polystyrene resin; a polyacrylonitrile resin; a polyvinyl alcohol resin; a polymethyl acrylate resin; a polymethyl methacrylate resin; a vinyl acetate resin; or a polycarbonate resin, or a mixture thereof can be used.

When thermoplastic resins having largely different processing temperatures or fluidity are used in the sheets, forming of the sheets is difficult, and therefore, it is desired that the same resin material is used in the sheets. When thermoplastic resins having a processing temperature or fluidity suitable for the forming of the sheets are used as constituent materials for the sheets, a material having a ratio of PETG:PC=5:5 to 3:7 is used in the two or more sheet materials (e.g., inner core sheets S2, S3) having the IC module 11 disposed therebetween, thus making it possible to suppress deterioration of the printing properties due to the card deformation caused by a lack of the heat resistance, and further, it is desired that all the sheet materials constituting the core layer 12 are individually comprised of a material having a ratio of PETG:PC=5:5 to 3:7.

These resins do not generate halogen gas including hydrogen chloride, which is considered to largely affect incinerators and the environment in the thermal disposal for the used resins. Therefore, the use of the above-mentioned resins facilitates waste disposal and makes it possible to lower a load on the environment.

A double-sided noncrystalline sheet prepared from, instead of the noncrystalline resin, a noncrystalline resin and a crystalline resin by a co-extrusion method can be used. Further, in the low crystalline polyester resin or another resin, an additive and a substance, such as a polymer, may be added in an amount of 50% by weight or less, preferably 15% by weight or less.

On the other hand, as a resin usable in the outer sheets 21, 22, a single material, e.g., polyimide; polyester, such as polyester, polyethylene terephthalate, or polyethylene naphthalate; polyolefin, such as propylene; cellulose, such as cellulose triacetate or cellulose diacetate; a vinyl resin, such as an acrylonitrile-butadiene-styrene resin, an acrylonitrile-styrene resin, polystyrene, polyacrylonitrile, polymethyl acrylate, polymethyl methacrylate, polyethyl acrylate, polyethyl methacrylate, vinyl acetate, or polyvinyl alcohol; or polycarbonate, or a mixture thereof can be used, and, for improving the bonding by hot melting, an adhesive layer may be additionally formed.

In the adhesive layer additionally formed, a single material, e.g., a polyester resin; a polyurethane resin; a polyester polyurethane resin; a vinyl resin, such as an acrylonitrile-butadiene-styrene resin, an acrylonitrile-styrene resin, polystyrene, polyacrylonitrile, polymethyl acrylate, polymethyl methacrylate, polyethyl acrylate, polyethyl methacrylate, vinyl acetate, or polyvinyl alcohol; a polycarbonate resin; or an epoxy resin, or a mixture or composite thereof can be used.

Next, the rewrite sheet 25 provided on one surface (upper surface as viewed in FIGS. 1 and 6 to 8) of the IC card 10 is formed as a rewritable rewritable display layer, and a printing operation is made by scanning a printing head on the rewrite sheet 25, and the rewrite sheet 25 is, for example, a rewritable rewritable heat-sensitive recording layer.

The heat-sensitive recording layer can be selected from a polymer/low-molecule-type heat-sensitive recording layer which reversibly changes from an opaque layer to a transparent layer depending on the change in the crystal state of the organic low-molecular substance dispersed in a resin matrix, and a leuco compound-type heat-sensitive recording layer comprised of a thermally coloring composition which utilizes a rewritable rewritable color reaction between an electron-donating coloring compound and an electron-accepting compound dispersed in a resin matrix. The heat-sensitive recording layer can be formed by a printing method, a coating method or the like so that the thickness becomes about 4 to 20 µm.

As examples of organic low-molecular substances dispersed in the polymer/low-molecule-type heat-sensitive recording layer, there can be mentioned fatty acids, fatty acid derivatives, and alicyclic organic acids, more specifically, saturated and unsaturated fatty acids and dicarboxylic acids, myristic acid, pentadecanoic acid, palmitic acid, heptadecanoic acid, stearic acid, nonadecanoic acid, arachic acid, behenic acid, lignoceric acid, cerotic acid, montanic acid, and melissic acid, and specific examples of unsaturated fatty acids include oleic acid, elaidic acid, linoleic acid, sorbic acid, and stearolic acid. The fatty acids, fatty acid derivatives, and alicyclic organic acids are not limited to these, and one of these or a mixture of two or more of these can be used.

As the resin matrix to be used, a single material, e.g., an acrylic resin, an urethane resin, a polyester resin, a cellulose acetate resin, a nitrocellulose resin, a vinyl chloride resin, or a vinyl acetate resin, or a mixture or copolymer thereof may be used. In addition, for controlling the range of temperatures at which the rewritable heat-sensitive recording portion becomes transparent, a plasticizer for the resin, a high-boiling point solvent or the like can be added in an amount of 0.1 to 20% parts by weight, based on the weight of the resin matrix. Further, for improving the rewritable heat-sensitive recording portion in resistance to repeated printing and erasing, a curing agent, a crosslinking agent or the like suitable for three-dimensionally crosslinking of the resin matrix can be added in an amount of 0.5 to 10% parts by weight, based on the weight of the resin matrix.

On the other hand, the leuco compound-type heat-sensitive recording layer can be formed from a thermally coloring composition, which utilizes a rewritable color reaction between the leuco compound and the color developing and erasing agent dispersed in the resin matrix, by a printing method, a coating method or the like so that the thickness becomes about 4 to 20 µm. As a generally colorless or pale color leuco compound used in the heat-sensitive recording layer, representatively, ones which are generally used in pressure sensitive recording paper, thermal recording paper, light sensitive recording paper, electro-thermo sensitive recording paper, or thermal transfer paper, i.e., xanthene, spiropyran, lactone, fluoran, and sultone compounds having a partial skeleton, such as lactone, sultone, or spiropyran are used, but there is no particular limitation.

Specific example of leuco compounds include 3,3-bis(p-dimethylaminophenyl)-6-dimethylaminophthalide, 3,3-bis(p-dimethylaminophenyl)phthalide, 3,3-bis(1,2-dimethylindole-3-yl)-6-dimethylaminophthalide, 3-dimethylamino-6- chloro-7-methylfluoran, 3,3-bis(9-ethylcarbazole-3-yl-5)-dimethylaminophthalide, 3-dimethylamino-7-dibenzylaminofluoran, 3-diethylamino-7-chlorofluoran, 3-diethylamino-6-methyl-7-anilinofluoran, 3-piperidino-6-methyl-7-anilinofluoran, 3-(n-ethyl-n-nitrile)amino-6-methyl-7-anilinofluoran, 3-dibutylamino-6-methyl-7-anilinofluoran, and 3-(n-ethyl-n-tetrahydrofuryl)amino-6-methyl-7-anilinofluoran, and these may be used individually or in combination.

The color developing and erasing agent is a compound which reversibly emits protons utilizing the effect of heat energy and has both color developing effect and color erasing effect for the leuco compound. In other words, the color developing and erasing agent has both an acidic group comprised of a phenolic hydroxyl group or a carboxyl group and a basic group comprised of an amino group, and becomes acidic or basic due to the change of heat energy to cause the leuco compound to be colored or erased. The basic group may be present either in the form of a functional group or in the form of part of the compound. Examples of color developing and erasing agents having any one of a functional group as an acidic group and a functional group as a basic group for the color developing and erasing agent include aminobenzoic acid, o-aminobenzoic acid, 4-amino-3-methylbenzoic acid, 3-amino-4-methylbenzoic acid, 2-amino-5-ethylbenzoic acid, 3-amino-4-butylbenzoic acid, 4-amino-3-methoxybenzoic acid, 3-amino-4-ethoxybenzoic acid, 2-amino-5-chlorobenzoic acid, 4-amino-3-bromobenzoic acid, 2-amino-2-nitrobenzoic acid, 4-amino-3-nitrobenzoic acid, 3-amino-4-nitrilebenzoic acid, aminosalicylic acid, diaminobenzoic acid, 2-methyl-5-aminonaphthoic acid, 3-ethyl-4-aminonaphthoic acid, nicotinic acid, isonicotinic acid, 2-methylnicotinic acid, and 6-chloronicotinic acid. As a color developing and erasing agent having a basic group in the form of part of a basic compound, there can be mentioned salts or complex salts of a compound having a phenolic hydroxyl group or a carboxyl group and a compound having an amino group, and examples include salts or complex salts of an acid, such as a hydroxybenzoic acid, a hydroxysalicylic acid, a gallic acid, or bisphenolacetic acid, and a base, such as an aliphatic amine, a phenylalkylamine, or a triallylalkylamine. Specific examples include p-hydroxybenzoic acid-alkylamine salts, p-hydroxybenzoic acid-phenylalkylamine salts, m-hydroxybenzoic acid-alkylamine salts, methyl p-hydroxybenzoate-alkylamine salts, stearyl p-hydroxybenzoate-alkylamine salts, bisphenolacetic acid-alkylamine, and octyl bisphenolacetate-alkylamine salts, and these may be used individually or in combination. The leuco compound and the color developing and erasing agent are not limited to these, and one of these or a mixture of two or more of these can be used.

As the resin matrix, a single resin, e.g., an acrylic resin, a polyester resin, a polyurethane resin, polyurea, melamine, polycarbonate, polyamide, polyvinyl pyrrolidone, polyvinyl alcohol, polyvinyl chloride, or polyvinyl butyral, or a mixture or copolymer thereof may be used. Further, for improving the rewritable heat-sensitive recording portion in resistance to repeated printing and erasing, a curing agent, a crosslinking agent or the like suitable for three-dimensionally crosslinking of the resin matrix can be added in an amount of 0.5 to 10% parts by weight, based on the weight of the resin matrix. In addition, for further improving the resistance, an ultraviolet absorber having relatively high compatibility with the leuco compound can be added.

As a method for producing the IC card 10 of the present invention, a melting lamination method by means of a hot-press can be used. The melting lamination method is a method in which materials for the card are together disposed between mirror plates larger than them and integrated by means of a hot-melt press. As the mirror plate used in this instance, a nickel-chromium plated copper plate, a stainless steel plate having a polish surface, or an aluminum plate having a polish surface can be used. In the melting lamination method, transparent protecting sheets are laminated on both surfaces of the printed card, and, in this case, the types of the protecting sheets on the both surfaces may be different, respectively. Characters or patterns can be printed on the card by a printing method used for conventional paper and plastics, specifically, a known printing method, such as an offset printing method, a screen printing method, or a gravure printing method.

After the melting lamination, the integrated card material is peeled off the mirror plates, and punched out into a card form by means of single-edged or male-female dies.

After punching into a card form, generally, characters are embossed on the card by means of an embosser, and the embossed characters are colored by tipping using a thermal transfer foil, or magnetic information is encoded on magnetic stripes, and, if desired, a facial portrait, a barcode or the like is transferred to finish the IC card. Further, for improving the pattern printed layer in, e.g., resistance to wear, a protecting layer can be provided. Furthermore, for providing a contact IC chip, the surface of the card is cut to form a recess, and then an IC chip is embedded in the recess using an adhesive, so that a combination or hybrid card having both a non-contact IC and a contact IC can be prepared.

EXAMPLES

Next, Experimental Examples 1 to 36 conducted for checking the effect of the present invention will be described. In the following Experimental Examples, an explanation is made with reference to specific values, but the present invention is not limited by these values.

In the following Examples, mainly, IC cards having the structure examples shown in FIGS. 6 to 8 were prepared as samples for evaluation wherein the thickness values of and the materials for the sheet materials constituting the core layer having the IC module disposed therein were changed, and examinations for evaluation of the printing properties with respect to the rewrite layer on the card surface were conducted.

Experimental Example 1

An IC card 10A having the structure example shown in FIG. 6 was prepared as a sample for evaluation.

(1) First, an IC module 11 was produced as follows.

A polyester polyurethane resin solution was applied to an insulating substrate 19 comprised of polyethylene terephthalate having a thickness of 50 μm and dried to form a bonding layer having a thickness of 5 μm. Then, an aluminum foil was put on the adhesive layer and a resist was applied onto the aluminum foil, and then subjected to exposure and development treatment to form a resist pattern for antenna circuit, followed by etching treatment, thus forming an antenna pattern comprised of aluminum. The thickness of the insulating substrate 19 including the antenna pattern was 60 μm. Next, an IC chip (4 mm×4 mm) 14 was mounted by face down bonding on the IC mounted portion of the insulating substrate 19 through an anisotropic conductive layer 40 (see FIG. 4). Then, epoxy sealing resins 15, 17 are respectively applied to the IC mounted surface and the IC non-mounted surface of the insulating substrate 19, and further reinforcing plates 16, 18 made of SUS304H (diameter: 7 mm; thickness: 50 μm) are respectively placed thereon and cured at 100° C. to produce an IC module 11.

For measuring a projection height B1 on the IC mounted surface of the IC module 11 prepared and a projection height C1 on the IC non-mounted surface, the thickness of the whole module at the IC mounted portion was measured (30 specimens), and then the sealing resin on the IC non-mounted surface of the module was removed by means of a cutter and a projection height on the IC mounted surface was measured. In the measurement of the thickness, a digital micrometer, manufactured and sold by Mitutoyo Corporation, was used. The results of the measurement are as follows.

Thickness of whole module at IC mounted portion: 450 μm

Projection height B1 on IC mounted surface: 290 μm

Projection height C1 on IC non-mounted surface: 100 μm (2) Then, a core layer 12 was produced as follows.

As inner core sheets S2, S3 and outer core sheets S1, S4 constituting a core layer 12 wherein the outer core sheets were individually disposed as outer layers, a PET-G (copolymer of terephthalic acid, cyclohexanedimethanol, and ethylene glycol) sheet having incorporated thereinto commercially available white filler (titanium oxide) was prepared. The inner core sheet S3 adjacent to the IC mounted surface of the IC module 11 had a thickness of 290 μm, and the inner core sheet S2 adjacent to the IC non-mounted surface had a thickness of 100 μm. Each of the outer core sheets S1, S4 had a thickness of 100 μm. Through holes S3b, S2c each having a diameter of 8 mm were formed, respectively, in the inner core sheets S3, S2 in a region corresponding to the IC mounted portion. Heights B, C of the through holes S3b, S2c are automatically determined by the respective sheet thickness of the inner core sheets S3, S2.

The IC module 11 was disposed between the inner core sheets S2, S3 and they were temporarily fixed together by ultrasonic bonding. The outer core sheets S1, S4 were placed on the respective surfaces of the sheet group temporarily fixed, and then they were together disposed between stainless steel mirror plates each having a thickness of 3 mm through oriented polypropylene (OPP) films, and pressed and heat-melted by means of a hot-melt press under conditions such that the temperature was 150° C. and the pressing pressure was 0.98 MPa (10 kg/cm²). After solidification by cooling, the OPP films were peeled off to produce a core layer 12 having the IC module 11 disposed therein.

(3) Then, outer sheets (printing sheets) 21, 22 stacked on the surface (IC non-mounted surface) and back surface of the core layer 12 and a rewrite sheet (rewritable heat-sensitive recording sheet) 25 stacked on the top surface were produced as follows. Patterns for the card front surface and card back surface were individually printed on polyethylene terephthalate sheets each having a thickness of 75 μm by a silk printing/offset printing method, and then an adhesive composition having the formulation shown below was applied to the individual inner surfaces (surfaces which face the core layer) of the sheets by a gravure printing method so that the thickness of the composition applied became 3 μm, and then dried at a drying temperature of 100° C. to prepare a front surface printing sheet 22 and a back surface printing sheet 21. Further, as a rewritable heat-sensitive recording sheet 25, a commercially available leuco coloring-type rewrite sheet shown below was prepared.

| <Adhesive composition> | |
|---|---|
| Polyester resin: | 40 Parts by weight (28.6% by weight) |
| Toluene: | 50 Parts by weight (35.7% by weight) |
| Methyl ethyl ketone: | 50 Parts by weight (35.7% by weight) |

| <Rewritable heat-sensitive recording sheet> Manufactured and sold by MITSUBISHI PAPER MILLS LIMITED | |
|---|---|
| Substrate (PET) thickness: | 25 μm |
| Recording layer thickness: | 7 μm |
| Protecting layer thickness: | 3 μm |

(4) Forming of a card was conducted as follows.

The top surface printing sheet 22 and rewritable heat-sensitive recording sheet 25 prepared in (3) above were placed on the surface (IC non-mounted surface) of the core layer 12 prepared in (2) above so that the recording layer was disposed as an outer layer, and the back surface printing sheet 21 prepared in (3) above was placed on the back surface (IC mounted surface) of the core layer 12, and then they were temporarily fixed together using an ultrasonic bonding machine. The sheet group temporarily fixed was disposed between stainless steel mirror plates each having a thickness of 3 mm through OPP films, and pressed and heat-melted by means of a vacuum hot-melt press under conditions such that the temperature was 120° C. and the pressing pressure was 0.98 MPa (10 kg/cm²). After solidification by cooling, the OPP films were peeled off and the card formed product was taken out, followed by punching out into a card form, to produce a non-contact IC card having a rewritable heat-sensitive recording layer in Experimental Example 1.

Experimental Examples 2 to 15

IC cards 10A having the structure example shown in FIG. 6 were individually prepared as samples for evaluation in accordance with substantially the same procedure as in Experimental Example 1 except that the inner core sheets S2, S3 having the respective thickness values shown in FIG. 9 1 were used in these Experimental Examples.

Experimental Example 16

An IC card 10A having the structure example shown in FIG. 6 was produced as a sample for evaluation in accordance with substantially the same procedure as in Experimental Example 1 except that, as constituent materials for the inner core sheets S2, S3, the materials shown in FIG. 9 were used in this Experimental Example.

Experimental Example 17

An IC card 10A having the structure example shown in FIG. 6 was produced as a sample for evaluation in accordance with substantially the same procedure as in Experimental Example 1 except that, as constituent materials for the inner core sheets S2, S3 and the outer core sheets S1, S4, the materials shown in FIG. 9 were used in this Experimental Example.

Experimental Examples 18 to 32

IC cards 10B having the structure example shown in FIG. 7 were individually produced as samples for evaluation. In these Experimental Examples, the sheet materials constituting the core layer 12 having the IC module 11 prepared in (1) above disposed therein were comprised of three layers of inner core sheets S2, S3 and outer core sheet S1, and the thickness and constituent materials for the sheets are shown in FIG. 9.

Experimental Example 33

An IC card 10A having the structure example shown in FIG. 6 was produced as a sample for evaluation in accordance with substantially the same procedure as in Experimental Example 1 except that, as constituent materials for the inner core sheets S2, S3 and the outer core sheets S1, S4, the materials shown in FIG. 9 were used in this Experimental Example.

Experimental Example 34

An IC card 10B having the structure example shown in FIG. 7 was produced as a sample for evaluation. In this Experimental Example, the thickness and constituent materials for the inner core sheets S2, S3 and the outer core sheets S1 are shown in FIG. 9.

Experimental Example 35

An IC card 10A having the structure example shown in FIG. 6 was produced as a sample for evaluation in accordance with substantially the same procedure as in Experimental Example 1 except that, as constituent materials for the inner core sheets S2, S3 and the outer core sheets S1, S4 the materials shown in FIG. 9 were used in this Experimental Example.

Experimental Example 36

An IC card 10C having the structure example shown in FIG. 8 was produced as a sample for evaluation. In this Experimental Example, the thickness and constituent materials for the inner core sheets S2, S3 and the outer core sheets S1, S4 are shown in FIG. 9. In addition, in this Experimental Example, the height B of the through hole on the side of the IC mounted surface corresponds to the sum of the thickness of the inner core sheet S3 and the thickness of the outer core sheet S4, i.e., 300 μm.

With respect to the samples in Experimental Examples 1 to 36, the structure of the core layer, and the results of evaluations of the printing properties and the printing properties after the heat resistance test, and generation of halogen gas during the incineration are shown in FIG. 10.

In FIG. 10, in each of the columns for the sheet thickness C of the inner core sheet S2 (height of the through hole S2c), the sheet thickness B of the inner core sheet S3 (height of the through hole S3b), and the sum A (=B+C) of the heights of the sheet through holes, figures in [ ] indicate the difference between the individual height and the height C1, B1, or B1+C1, wherein B1 represents a projection height on the IC mounted surface of the IC module 11, and C1 represents a projection height on the IC non-mounted surface.

(5) Evaluation

Printing Properties

The printing properties of the rewritable heat-sensitive recording layer of the card were evaluated as follows. Printing was conducted using a thermal printer, manufactured and sold by Kyushu Matsushita Electric Co., Ltd., at energy applied to a thermal head of 0.45 mJ/dot, and, with respect to the region of the card front and back surfaces above the IC mounted portion, when print missing occurred, the printing properties were rated x (cross); when slight touching occurred on the printed portion, the printing properties were rated Δ (triangle); when print missing occurred slightly, the printing properties were rated ○ (circle); and when no print missing occurred, the printing properties were rated ◎ (double circle) (see FIG. 10).

When print missing or slight touching occurs on the periphery of the IC portion, the card surface is convex, whereas, when print missing or slight touching occurs on the IC portion, the card surface is concave. The spacing loss between the convex card surface and a thermal head is small, as compared to that in the concave card surface, and therefore the convex card surface is easy to achieve satisfied printing properties.

Heat Resistance

The IC card prepared was hold in an environment at 70° C./60% RH for 72 hours, and cooled down to room temperature and then, the printing properties were evaluated. The criteria for evaluation of the printing properties were the same as those mentioned above in connection with the printing properties.

From a comparison between Experimental Examples 1 to 15, it is found that, when the sum A of the thickness B of the inner core sheet S3 on the IC mounted surface (height of the through hole S3b) and the thickness C of the inner core sheet S2 on the IC non-mounted surface (height of the through hole S2c) falls in the range of ±30 μm of the sum (B1+C1 =390 μm) of the projection height B1 on the IC mounted surface of the IC module 11 and the projection height C1 on the IC non-mounted surface (i.e., in the range of from 360 to 420 μm), the printing properties are favorable (samples other than the samples having printing properties before the heat resistance test rated X were judged to have satisfied printing properties).

Particularly, from the results of the individual Experimental Examples, it is found that, when the thickness C of the inner core sheet S2 is in the range of ±30 μm of the projection height C1 on the IC non-mounted surface of the IC module 11 and the thickness B of the inner core sheet S3 is in the range of ±30 μm of the projection height B1 on the IC mounted surface of the IC module 11, favorable printing properties can be obtained. Further, it is found that, when a relationship (B1+C1)−20 μm≦A≦(B1+C1)+10 μm is satisfied, that is, A is in the range of from 370 to 400 μm, the printing properties are generally very satisfied.

Further, from a comparison between Experimental Examples 1, 16, 17, and 35, it is found that, when a PETG/PC thermoplastic resin sheet is used in at least part of the sheet materials constituting the core layer, the printing properties after the high-temperature and high-humidity environmental test at 70° C./60% RH for 72 hours do not deteriorate. The reason for this is presumed that a polymer alloy of PETG and PC has better heat resistance, as compared to a PETG single material, and suppresses deterioration of the printing properties.

On the other hand, from a comparison between Experimental Examples 17 and 21, it is found that, in the same structure for the thickness of the inner core sheets S2, S3, when the outer core sheet S4 is not formed on the opposite side of the rewritable heat-sensitive recording sheet 25 but the thickness of the outer core sheet S1 on the side of the rewritable heat-sensitive recording sheet 25 is increased to make up for a lack of the card thickness, the printing properties are more improved. The reason for this is presumed that the increase of the thickness of the outer core sheet S1 underlying the rewritable heat-sensitive recording sheet 25 makes it possible to prevent the uneven surface of the IC mounted portion from causing the card surface to become uneven.

Further, from a comparison between Experimental Examples 17 to 32, it is found that, in the structure in which the outer core sheet S4 is not formed but the thickness of the outer core sheet S1 is increased, when the sum A of the thickness of the inner core sheets S2, S3 falls in the range of (B1+C1)±30 µm, the printing properties are individually satisfied. Particularly, from the results of the individual Experimental Examples, it is found that, when the thickness C of the inner core sheet S2 is in the range of ±30 µm of the projection height C1 on the IC non-mounted surface of the IC module 11 and the thickness B of the inner core sheet S3 is in the range of ±30 µm of the projection height B1 on the IC mounted surface of the IC module 11, satisfied printing properties can be obtained. Further, it is found that, when a relationship (B1+C1)−20 µm≦A≦(B1+C1)+10 µm is satisfied, that is, A is in the range of from 370 to 400 µm, the printing properties are generally very favorable. Furthermore, it is found that no deterioration is found in the printing properties after the heat resistance test.

It is apparent that the above theory as such applies to Experimental Example 36. This Experimental Example is considered to have a structure comprising the outer core sheet S4 and two layers comprised of the inner core sheet S3 used in Experimental Example 21, and therefore it is considered that a similar effect can be obtained.

Finally, as is apparent from FIG. 9 and FIG. 10, when a PETG or PETG/PC material is used as a constituent material for the core layer like in Experimental Examples 1 to 32, 35, and 36, differing from Experimental Examples 33 and 34 using a vinyl chloride resin, there is no danger that halogen gas is generated during the incineration, thus making it possible to lower a load on the environment.

The preferred embodiments of the present invention are described above, but the present invention is not limited to these embodiments, and they can be changed or modified based on the technical concept of the present invention.

For example, in the above embodiments, explanation is made on the IC card as an example in which the rewrite sheet 25 is formed only on the surface of the card on the side of the IC non-mounted surface, but the present invention is not limited to this, and the present invention can be applied to an IC card having a similar rewrite sheet formed on the back surface of the card on the side of the IC mounted surface, and an IC card having a rewrite sheet formed only on the back surface of the card, and favorable printing properties can be obtained similarly.

What is claimed is:

1. An IC card comprising:
   an IC module which comprises an IC chip mounted on an insulating substrate having an antenna coil, a sealing material which encapsulates said IC chip, and a chip reinforcing plate provided on at least an IC mounted surface of said insulating substrate and formed on said IC chip through said sealing material; and
   a core layer comprising a plurality of sheet materials having said IC module disposed therebetween,
   wherein,
   in said plurality of sheet materials, at least the sheet materials adjacent to said IC module have a through hole (a) for containing therein said IC chip said sealing material and said chip reinforcing plate, and (b) formed to penetrate the adjacent sheet materials in a region corresponding to an IC mounted portion of said IC module before placing said IC chip therein,
   said plurality of sheet materials constituting said core layer comprise at least a pair of inner core sheets adjacent to said IC module,
   a relationship (B1+C1)−20 µm≦A≦(B1+C1)+10 µm is satisfied, where A (µm) represents the sum of heights of said through holes, B1 (µm) represents a projection height from an IC mounted surface of said IC module, and C1 (µm) represents a projection height from an IC non-mounted surface of said IC module,
   the relationships B=B1±30 µm, and C=C1±30 µm are satisfied, wherein B (µm) represents a height of said through hole on the side of the IC mounted surface of said IC module, and C (µm) represents a height of said through hole on the side of the IC non-mounted surface of said IC module, and
   said through holes are larger than at least one of a length and a width of said sealing material and than at least one of a length and a width of said chip reinforcing plate so as to form at least one empty region in said through holes.

2. The IC card according to claim 1, wherein said plurality of sheet materials constituting said core layer comprise at least a pair of inner core sheets adjacent to said IC module, and an outer core sheet stacked on at least one of said pair of inner core sheets.

3. The IC card according to claim 1, wherein said core layer has a rewritable display layer formed on at least one surface of said core layer.

4. The IC card according to claim 1, wherein, in said sheet materials constituting said core layer, at least a pair of sheet materials having said IC module disposed therebetween includes a material comprising a copolymer of terephthalic acid, cyclohexanedimethanol and ethylene glycol, and polycarbonate.

5. The IC card according to claim 1, wherein said sheet materials constituting said core layer comprise a no-chlorine-containing material.

6. An IC card comprising:
   an IC module which comprises an IC chip mounted on an insulating substrate having an antenna coil, a sealing material which encapsulates said IC chip, and a chip reinforcing plate provided on at least an IC mounted surface of said insulating substrate and formed on said IC chip through said sealing material; and
   a core layer comprising a plurality of sheet materials having said IC module disposed therebetween,
   wherein,
   in said plurality of sheet materials, at least the sheet materials adjacent to said IC module have a through hole (a) for containing therein said IC chip said sealing material and said chip reinforcing plate, and (b) formed to penetrate the adjacent sheet materials in a region corresponding to an IC mounted portion of said IC module before placing said IC chip therein, a relationship of (B1+C1)−20 μm ≦ A ≦ (B1+C1)+10 μm is satisfied, wherein A (μm) represents the sum of heights of said through holes, B1 (μm) represents a projection height on an IC mounted surface of said IC module, and C1 (μm) represents a projection height on an IC non-mounted surface of said IC module, the relationships B=B1±30 μm, and C=C1±30 μm are satisfied, wherein B (μm) represents a height of said through hole on the side of the IC mounted surface of said IC module, and C (μm) represents a height of said through hole on the side of the IC non-mounted surface of said IC module, and said through holes are larger than at least one of a length and a width of said chip reinforcing plate so as to form at least one empty region in said through holes.

* * * * *